US010043798B2

(12) United States Patent
Cosemans et al.

(10) Patent No.: US 10,043,798 B2
(45) Date of Patent: Aug. 7, 2018

(54) BURIED INTERCONNECT FOR SEMICONDUCTOR CIRCUITS

(71) Applicant: IMEC VZW, Leuven (BE)

(72) Inventors: Stefan Cosemans, Mol (BE); Praveen Raghavan, Bertem (BE); Steven Demuynck, Aarschot (BE); Julien Ryckaert, Tervuren (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/247,127

(22) Filed: Aug. 25, 2016

(65) Prior Publication Data

US 2017/0062421 A1  Mar. 2, 2017

(30) Foreign Application Priority Data

Sep. 1, 2015 (EP) .................................. 15183286

(51) Int. Cl.
*H01L 27/088* (2006.01)
*H01L 27/02* (2006.01)
*H01L 21/8234* (2006.01)
*H01L 21/768* (2006.01)
*H01L 23/535* (2006.01)
*H01L 21/74* (2006.01)
*H01L 29/78* (2006.01)

(52) U.S. Cl.
CPC ........ *H01L 27/0886* (2013.01); *H01L 21/743* (2013.01); *H01L 21/76895* (2013.01); *H01L 21/823431* (2013.01); *H01L 21/823475* (2013.01); *H01L 23/535* (2013.01); *H01L 27/0207* (2013.01); *H01L 29/785* (2013.01)

(58) Field of Classification Search
None
See application file for complete search history.

(56) References Cited

U.S. PATENT DOCUMENTS

| 5,100,817 A * | 3/1992 | Cederbaum ......... H01L 21/8221 257/E21.614 |
| 5,124,774 A * | 6/1992 | Godinho ............... H01L 21/768 257/380 |
| 6,143,595 A | 11/2000 | Hsu |
| 6,764,893 B2 | 7/2004 | Lee et al. |
| 7,297,998 B2 | 11/2007 | Kim et al. |
| 7,388,243 B2 | 6/2008 | Yun et al. |

FOREIGN PATENT DOCUMENTS

WO   WO 03/107430 A1   12/2003

* cited by examiner

*Primary Examiner* — Kimberly Rizkallah
*Assistant Examiner* — Bo Bin Jang
(74) *Attorney, Agent, or Firm* — Knobbe Martens Olson & Bear, LLP

(57) ABSTRACT

A semiconductor circuit comprises a Front End of Line (FEOL) comprising a plurality of transistors, each of which having a source region, a drain region and a gate region arranged between the source region and the drain region and comprising a gate electrode. The semiconductor circuit also comprises a buried interconnect that is arranged in the FEOL and electrically connected to the gate region from below through a bottom contact portion of the gate electrode. By using a buried interconnect the routing of the circuit may be facilitated.

13 Claims, 5 Drawing Sheets

US 10,043,798 B2

BURIED INTERCONNECT FOR SEMICONDUCTOR CIRCUITS

INCORPORATION BY REFERENCE TO RELATED APPLICATIONS

Any and all priority claims identified in the Application Data Sheet, or any correction thereto, are hereby incorporated by reference under 37 CFR 1.57. This application claims the benefit of EP 15183286.2 filed Sep. 1, 2015. The aforementioned application is incorporated by reference herein in its entirety, and is hereby expressly made a part of this specification.

TECHNICAL FIELD OF THE INVENTION

Semiconductor circuits are provided. In particular, integrated circuits comprising an array of transistors, such as, e.g., finFETs, and a buried interconnect are provided.

BACKGROUND OF THE INVENTION

There is a continuous need for smaller semiconductor circuits having increased circuit density. Random-access memories are examples of integrated circuits wherein a bit of data may be stored using transistors arranged in a memory cell, and wherein the density and size of the transistors may determine the size and performance of the memory device.

An important parameter when manufacturing integrated circuits is the electrical interconnection between the devices and components forming the integrated circuit. An interconnect generally may comprise a region of electrically conducting material that is formed between the devices or components so as to provide an electrical contact there between.

In WO 03/107430, a buried interconnect is formed in an isolated trench in a semiconductor substrate so as to facilitate the electrical routing at to allow for an increased circuit density. The buried interconnect is arranged to conductively couple to conductive lines formed above the substrate, wherein the conductive lines may be connected to devices such as transistors.

Although such a structure may provide an increased circuit density, there is still a need for alternative semiconductor circuits having a relatively small area and/or high circuit density.

SUMMARY OF THE INVENTION

An object of at least some of the embodiments is to provide a semiconductor circuit having a high circuit density, and a method of manufacturing such a semiconductor circuit.

At least one of this and other objects is achieved by means of a semiconductor circuit and a method of manufacturing having the features defined herein and in the independent claims. Certain embodiments are described herein and by the dependent claims.

According to a first aspect, a semiconductor circuit is provided, having a Front End of Line (FEOL) and a plurality of transistors. Each transistor comprises a first terminal region, such as a source region, a second terminal region, such as a drain region, and a third terminal region such as a gate region arranged between the first and second terminal regions. The gate region may, e.g., comprise an electrically conductive gate electrode. The semiconductor circuit also comprises a first buried interconnect arranged in the FEOL and electrically connected to at least one of the gate regions from below through a bottom contact portion of the gate region or gate electrode.

According to a second aspect, a method of manufacturing a semiconductor circuit is provided. The method comprises forming a first buried interconnect and a plurality of transistors in a FEOL. Each transistor comprises a first terminal region, such as a source region, a second terminal region, such as a drain region, and a third terminal region such as a gate region arranged between the first and second terminal regions. Further, the first buried interconnect is electrically connected to at least one of the gate regions from below through a bottom contact portion of the gate region or an gate electrode of the gate region.

The semiconductor circuit may be formed in or on a substrate, wherein the drain regions and the source regions are formed as spaced-apart regions or islands on the substrate. The drain regions and the source regions may be arranged in an array extending in a lateral direction, i.e., along a surface of the substrate. The array may be defined by alternating drain regions and source regions, wherein a drain region may be neighbored by a source region, and vice versa. The array may be one dimensional or extend in two dimensions.

The term "FEOL" as used herein is a broad term, and is to be given its ordinary and customary meaning to a person of ordinary skill in the art (and is not to be limited to a special or customized meaning), and refers without limitation to an intermediate product resulting from the processing step up to the finalization of the FEOL-devices, e.g., transistors, including the formation of the contacting terminals of the FEOL-devices, e.g., the silicidation of the source/drain regions. The substrate wherein the FEOL devices may be formed is part of the FEOL. The steps for forming the FEOL are the FEOL-processing steps as known in the art.

The terms "contact" and "connect" as used herein are broad terms, and are to be given their ordinary and customary meaning to a person of ordinary skill in the art (and are not to be limited to a special or customized meaning), and refer without limitation to an electrical or ohmic connection or communication between two elements, surfaces or structures so as to allow an electromagnetic interaction there between, and in particular to allow an electrical current to flow there between.

The term "lateral" as used herein is a broad term, and is to be given its ordinary and customary meaning to a person of ordinary skill in the art (and is not to be limited to a special or customized meaning), and refers without limitation to a direction along a main surface of the substrate in or on which the semiconductor circuit is formed. Accordingly, the term "vertical" as used herein is a broad term, and is to be given its ordinary and customary meaning to a person of ordinary skill in the art (and is not to be limited to a special or customized meaning), and refers without limitation to a direction intersecting a lateral plane of the semiconductor device, and in particular to a directions extending along a thickness direction of the substrate. The substrate may comprise an upper side, on which the transistors are formed, and a lower side, opposite from the upper side. The term "up", "top" or "above" may, in the context of the present application, refer to the direction in which the upper side of the substrate faces, whereas the term "down", "bottom" or "below" may refer to the direction in which the lower side of the substrate faces.

Each transistor, or at least some of the transistors, of the semiconductor circuit may be formed by a source region that neighbors, or is arranged adjacent to, a drain region and a gate region that is arranged there between. The gate region may, e.g., comprise or be formed of one or several layers of gate oxide(s), such as a gate stack. The gate region may further comprise a gate electrode, e.g., polycrystalline silicon and/or a metal, for electrical connection of the gate region, e.g., to the gate terminal. Each transistor further comprises a channel region that extends from the source region to the drain region. In the channel portion of the gate region the gate region at least partially overlaps the channel region and allows for thin oxides for a transistor to be formed on top of an active (doped) semiconductor material of the channel region. In the remainder portion of the gate region, i.e., the portion distant from the channel region, a thick dielectric (compared to gate oxide) may be arranged between, e.g., the gate electrode and the channel region. In some examples, the gate electrode may be formed as a conductive line or strip, and/or arranged in (or at least connected to) a grid of preferably parallel strips. A same gate electrode may be electrically connected to the gate region of several different transistors. It will be appreciated that the term "gate region" may also refer to a specific portion of a gate electrode being arranged between a drain region and a source region, thereby forming part of a transistor.

The buried interconnect and the gate electrodes may have a main extension in different planes, wherein the buried interconnect, e.g., may be arranged in a plane or layer below the plane or layer in which the gate electrodes are arranged. In case the gate electrodes are formed as one or several strips, the buried interconnect may extend orthogonal to the strips. The semiconductor circuit may also comprise two or more buried interconnects that, e.g., may be arranged in a parallel grid orthogonally oriented to, e.g., the grid of gate electrodes.

The gate regions and/or the buried interconnect may be electrically isolated from the surroundings by, e.g., a dielectric. The isolation may be locally opened to provide a contact opening or portion through which the gate regions and/or the first buried interconnect may be electrically contacted. The electrical contact may, e.g., be provided through a gate electrode. In one example, a contact opening may be arranged in an electrically isolating layer between a gate region and the first buried interconnect. The isolation surrounding the first buried interconnect may be selectively opened for example through the top side, i.e., a side facing away from the substrate, so as to select which gate region(s) to electrically connect with the first buried interconnect. The first buried interconnect may be directly contacted to the gate electrode, through the contact opening in the bottom side of the gate electrode. The contact opening may advantageously be located in the remainder portion of the gate region distant from the channel region. The buried interconnect may be contacted from above by means of, e.g., a local interconnect.

By electrically contacting a gate region from below through a bottom contact portion of the gate region or gate electrode, the routing in above metal layers may be facilitated and the area required for routing may be reduced.

According to an embodiment, the semiconductor circuit may comprise a Middle End of Line (MOL) comprising a first local interconnect arranged to electrically connect the first buried interconnect to a first contact area of a metal layer of a Back End of Line (BEOL). The first local interconnect may be arranged distant from a gate electrode of a first one of the transistors and distant from a neighboring gate electrode of a second one of the transistors. The MOL may hence be referred to as an intermediate layer or structure connecting the FEOL device terminals to the BEOL routing, and the first local interconnect may therefore extend in a vertical direction or, in other words, from the FEOL and up to the BEOL.

The first local interconnect may be arranged in a region where there are no source or drain regions, preferably to provide electrical connection between a gate region and a contact area of the metal layer, e.g., Metal1, of the BEOL. Alternatively, or additionally, the local interconnect may be arranged to connect a source or drain region to a buried interconnect, wherein the local interconnect may be arranged in, or extend through, the source or drain region. The local interconnect may be electrically connected to the buried interconnect through an electrical contact provided between a lower portion of the local interconnect and an upper portion of the buried interconnect, wherein the electrical contact, e.g., may be formed in a dielectric isolating the buried interconnect from the surroundings.

Since the first buried interconnect may be electrically connected to a gate region from below through a bottom contact portion in the gate electrode, the first local interconnect allows for the gate region to be electrically accessed from above, i.e., from the BEOL, through the first local interconnect in the MOL to the gate electrode. Compared to a direct connection, from the BEOL, to the gate region or gate electrode from above not having a buried interconnect, the present embodiment further allows for the gate region to be contacted at a position that is laterally displaced or shifted relative to the lateral position of the gate region or gate electrode. Hence, a gate region may be contacted from above at a position located between the gate region and a neighboring gate region. The lateral shift of the gate region contact allows for the contact to be aligned with the metal layers that are formed above the gate region layer, e.g., Metal 1, without any need for multiple levels of staggered local interconnects and un-landed vias. Reducing the need for un-landed vias and staggered or stairway local interconnects is advantageous as these may come to close to the neighboring gate and cause electrical shortcuts through the dielectric. Further, the footprint of the semiconductor circuit may be reduced.

According to an embodiment, the first contact area, which may be electrically connected to the first local interconnect, may be aligned with a second contact area of the metal layer. The second contact area may be located between the gate electrode of the first one of the transistors and the neighboring gate electrode of the second one of the transistors. Further, the MOL may comprise a second local interconnect adapted to electrically connect the second contact area to the source region or to the drain region of at least one of the transistors. The present embodiment allows for the electrical contacts for the gate regions to be aligned with electrical contacts of the drain regions or source regions, which may be directly contacted from above, so as to facilitate the routing in the BEOL and to reduce the footprint of the semiconductor device.

According to an embodiment, the metal layer of the BEOL may comprise at least one metal strip aligned between the gate electrodes of neighboring transistors and electrically connected to at least some of the neighboring transistors through local interconnects in the MOL.

According to some embodiments, the gate regions/electrodes, buried interconnect and/or local interconnect may be electrically isolated from their surroundings. The isolation may, e.g., be provided by a dielectric that, e.g., may be formed as a spacer improving the electrical insulation between, e.g., adjacent gate regions/electrodes and reducing the parasitic capacitance and the risk for short-cuts or dielectric breakdown. The spacer may completely fill the space between two adjacent gate regions/electrodes or be provided as a layer formed on the lateral sides of each gate region/electrode. By arranging the local interconnect between a dielectric spacer or isolation of one gate region and a dielectric spacer or isolation of an adjacent gate region, the dielectric isolation may be intact, i.e., the local interconnect may be formed without removing or reducing the thickness of the dielectric isolation. Maintaining an as large as possible lateral distance between the local interconnect and the gate electrode material may reduce the risk for unwanted electromagnetic interaction or short-cuts.

According to an embodiment, the semiconductor circuit may comprise a second buried interconnect that is arranged in the FEOL and electrically connected to at least one source region or drain region through a third local interconnect arranged in the MOL. The second buried interconnect may further be adapted to supply the source region or drain region with an electrical power, for example a supply voltage or a ground voltage. The second buried interconnect may also be referred to as a power interconnect.

The power interconnect may be similarly configured as the first buried interconnect described in connection with the above embodiments, and may extend along the first buried interconnect. The power interconnect may be adapted to supply the drain or source regions of several transistors with electrical power.

According to some embodiments, at least one of the transistors may be a fin-based transistor, such as a finFET, comprising a fin extending between the source region and the drain region of the transistor. Preferably, the semiconductor circuit may comprise a plurality of fins forming a plurality of fin-based transistors. The fins may, e.g., be arranged in parallel trenches in the FEOL.

The source regions and the drain regions of the semiconductor circuit may be formed on the respective fins by epitaxial growth.

According to an embodiment, the bottom contact portion of the gate electrode may be arranged between the top of the fin(s) and the bottom of the gate electrode, as seen in a vertical direction of the circuit. In other words, the top of the fins and the top of the buried interconnect may in one example be arranged at essentially the same vertical level, wherein the top of the fins may form an essentially flat surface with the top of the buried interconnect. The essentially flat surface may, e.g., be subject to a planarization step prior to providing the gate electrode, wherein the bottom contact portions of the gate electrode may be arranged at essentially the same vertical level as the top of the fins. Alternatively, the fins may protrude out from the surface onto which the gate electrode bottom contact portion is to be provided, such that the top of the fins are arranged at a higher vertical level than the top of the buried interconnect. The gate electrode may hence be arranged to at least partially enclose or receive the protruding portions of the fins. The protruding portions of the fins may, e.g., be provided after a planarization step by, e.g., epitaxial growth. The fins may in some examples be etched back before the protruding portions are grown onto the fins.

It will be appreciated that the FEOL of the semiconductor circuit may be formed of a semiconductor substrate comprising, e.g., silicon, silicon dioxide, gallium arsenide, silicon carbide, or any other suitable semiconductor material known in the art. Further, thin film technology may be used for forming layers of the semiconductor circuit. The layers may, e.g., be formed by depositing techniques such as PVD, CVD, ALD, and solution deposition. The layers may comprise materials such as silicon, different types of oxides, and metals such as, e.g., copper, titanium, cobalt and tungsten, or combinations thereof. Structures may be formed in the layers by means of lithography and selective etching.

It will also be appreciated that other embodiments than those described above are also possible. Further objectives of, features of, and advantages with the present invention will become apparent when studying the following detailed disclosure, the drawings, and the appended claims. Those skilled in the art will realize that different features of the present invention can be combined to create embodiments other than those described in the following.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, in which.

All the figures are schematic, not necessarily to scale, and generally only show parts which are necessary in order to elucidate the embodiments of the present invention, wherein other parts may be omitted or merely suggested.

DETAILED DESCRIPTION

The present invention will now be described more fully hereinafter with reference to the accompanying drawings, in which exemplifying embodiments of the present invention are shown. The present invention may, however, be embodied in many different forms and should not be construed as limited to the embodiments set forth herein; rather, these embodiments are provided by way of example so that this disclosure will convey the scope of the invention to those skilled in the art. Furthermore, like numbers refer to the same or similar elements or components throughout.

Figure 1:
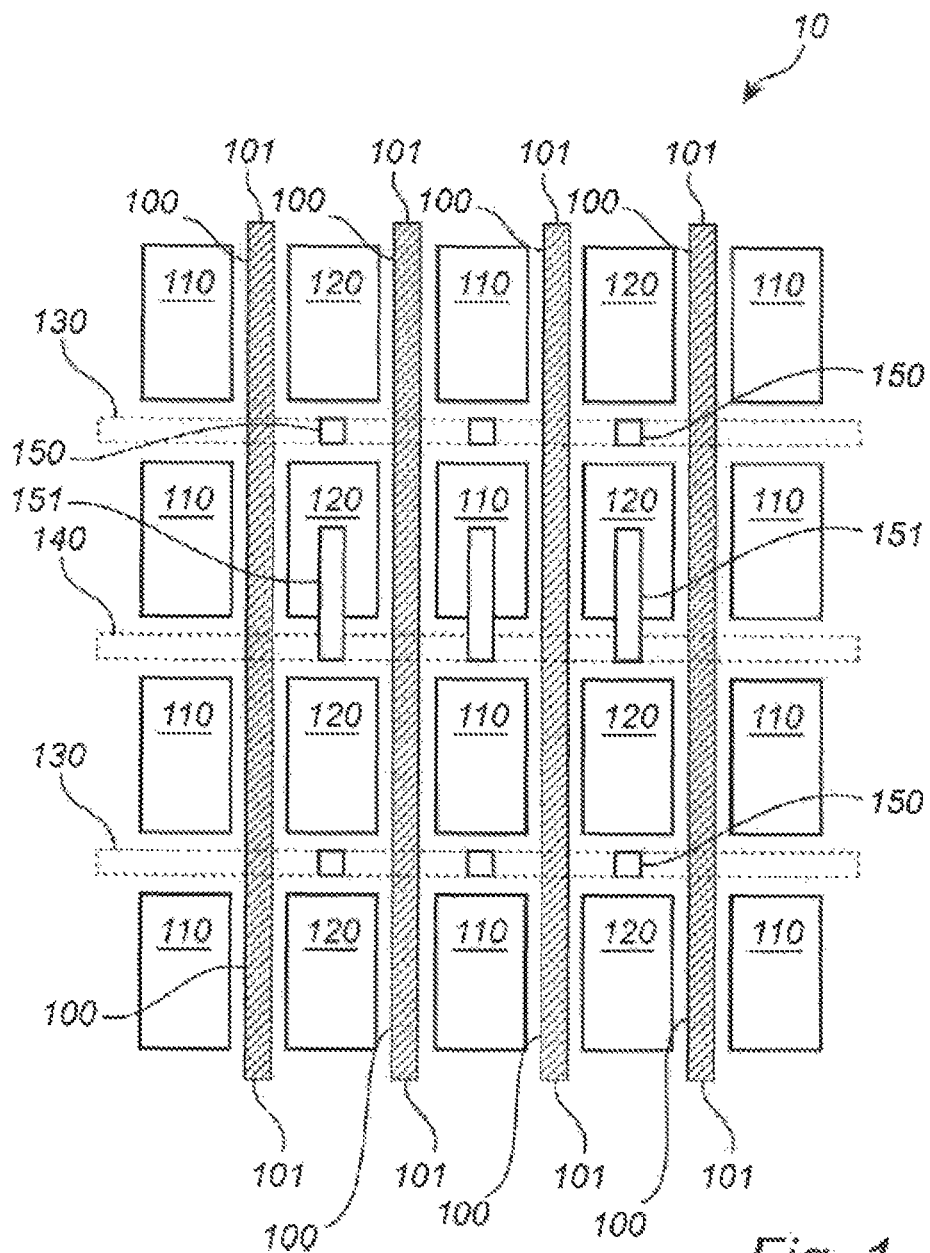
FIG. 1 schematically depicts a top view of a semiconductor circuit according to an embodiment, wherein the relative orientation of the gate electrodes, the source and drain regions, the buried interconnects and the local interconnects is indicated, FIG. 2 schematically depicts a cross sectional side view of a portion of a semiconductor circuit according to an embodiment, illustrating the connection between a metal layer, arranged above the gate regions, and a gate electrode through the buried interconnect, FIG. 3 schematically depicts a perspective view of a portion of a semiconductor device according to an embodiment, FIGS. 4a and 4b schematically depicts a cross sectional side view of a portion of a semiconductor device comprising fin-based transistors.

With reference to FIG. 1, there is shown a top view of a semiconductor circuit 10 according to an embodiment.

The semiconductor circuit 10 may comprise a plurality of transistors, each comprising at least at least one source region 110 and at least one drain region 120 in a Front End of Line (FEOL), and may together with an intermediate gate region 100 form a transistor. The gate region 100 may be separated or conductively isolated from the source region 110 and the drain region 120 by an intermediate dielectric, such as, e.g., an oxide layer (not show in FIG. 1). The transistor may, e.g., be a field-effect transistor. Further, the gate region 100 of the transistor may comprise, be connected to or form part of a gate electrode 101 which, e.g., may be formed as a conductive strip. A plurality of gate electrode strips 101 may form a lateral grid of gate strips 101, which according to the present embodiment may be formed as parallel conductive lines. The transistors further comprising a channel in a channel region extending between the source region and drain region, wherein a thin oxide may be formed to achieve the field-effect transistor. The gate region may at least partially cover the channel region in the channel portion of the gate region. The gate region may extend beyond the channel region in a portion distant from the channel portion, also called the remaining portion.

The semiconductor circuit 10 may further comprise a buried interconnect 130 (indicated by dashed lines in FIG. 1), which may be formed as a conductor extending in a layer at least partially beneath the gate electrodes 101 and/or the source/drain regions 110, 120. According to the exemplifying embodiment in FIG. 1, the buried interconnect 130 may have a length extension in a direction orthogonal to the length extension of the gate electrodes 101. Further, the buried interconnect 130 may be laterally arranged between one or several source/drain regions 110, 120 or transistors. The buried interconnect 130 may be adapted to electrically, or conductively, contact at least one of the gate electrodes 101 from below, e.g., through a contact portion, for example an opening, in a dielectric insulating layer between the gate electrode 101 and the buried interconnect 130. As indicated in FIG. 1, the semiconductor circuit may comprise a plurality of buried interconnects 130, for example arranged in a parallel grid that may be, e.g., orthogonal to the grid of gate strips 101.

According to some embodiments, the semiconductor circuit may comprise further buried interconnects, or power interconnects 140, which may be adapted to connect one or several of the source/drain regions with an electric power supply. The power interconnect 140 may be similarly configured as the buried interconnect described above, and may be arranged to extend in regions of the FEOL absent of source or drain regions 110, 120. The power interconnect 140 may, e.g., be arranged in regions between neighboring transistors. The source/drain regions 110, 120 may be electrically connected to the power interconnect 140 through a local interconnect 151 arranged in the Middle End of Line (MOL) and adapted to provide the source/drain regions 110, 120 with an electrical power.

According to some embodiments, a local interconnect 150, 151 of the MOL may be arranged in between two adjacent gate strips 101 such that it extends through a layer in which the gate strips 101 are arranged and down to the buried interconnect 130, 140. The local interconnect 150, 151 may, e.g., be provided by selectively etching a trench to expose the buried interconnect 130, 140 and filling the trench with an electrically conducting material so as to form a via connection. The local interconnect 150, 151 may be used for providing an electrical connection between the buried interconnect 130, 140 and subsequent metal layers arranged above the layer comprising the gate strips 101. Further, by providing an electrical contact between a gate strip 101 and the buried interconnect 130, the gate strip 101 may be electrically accessed from a Back End of Line (BEOL) 164 through the local interconnect 150 in the MOL. Arranging the local interconnect laterally between two gate strips 101 also allows for a gate strip 101 to be electrically contacted from a position laterally beside the gate strip 101, for example in the region aligned with the local interconnect 151 of the source/drain regions 110, 120.

It will be appreciated that the figures are merely a schematic representation elucidating some embodiments. The structures and features of the present figure are not necessarily to scale. For example, a footprint of the structures of the MOL, such as, e.g., any one of the local interconnects 150, 151, may be smaller than, equal to or larger than a footprint of any one of the source/drain regions 110, 120.

Figure 2:
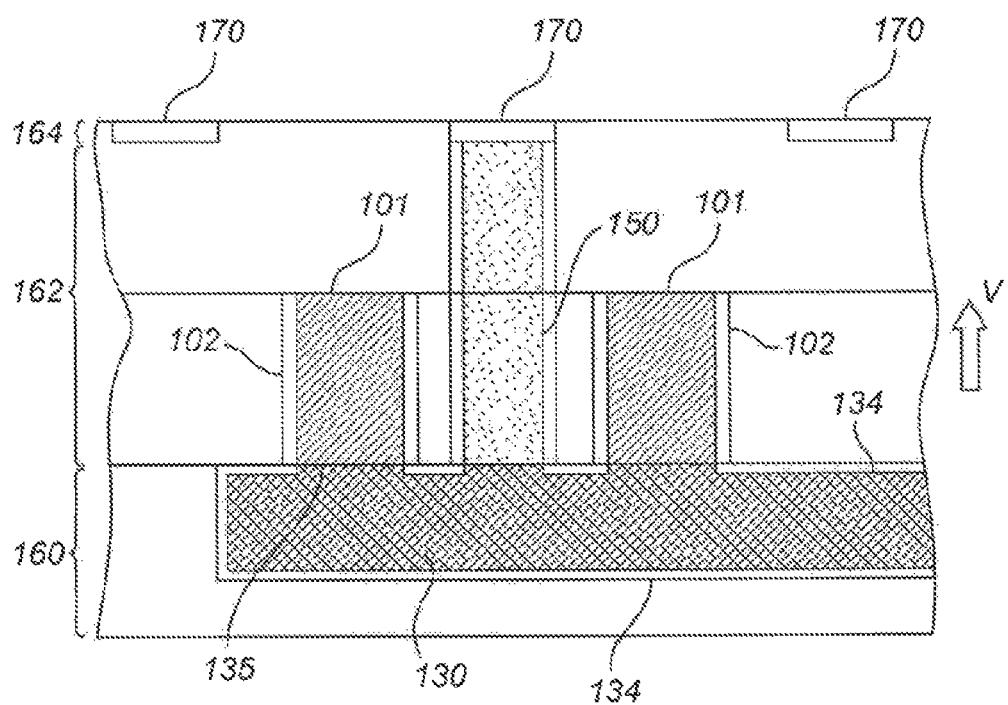

FIG. 2 is a vertical cross section taken along a buried interconnect 130 contacting a gate electrode 101 according to an embodiment of a semiconductor circuit that may be similarly configured as the semiconductor circuit described with reference to FIG. 1. The vertical direction V is indicated by an arrow. FIG. 2 illustrates a portion of a semiconductor circuit comprising a FEOL 160, two gate electrodes 101, a buried interconnect 130 and a contact 170 of a metal layer in the BEOL 164. The gate electrodes 101 may be electrically isolated from the surroundings by a dielectric spacer 102. According to the embodiment shown in FIG. 2, the buried interconnect 130 may be arranged below the gate electrodes 101 and may be provided with an isolating layer 134 separating the buried interconnect 130 from its surroundings. As illustrated in FIG. 2, a first one of the gate electrodes 101 may be electrically connected to the buried interconnect 130 by means of an opening 135 in the isolating layer 134, whereas the other gate electrode 101 may be electrically isolated or disconnected from the buried interconnect 130 by means of the isolating layer 134.

The local interconnect 150 may be arranged in between the gate electrodes 101. The local interconnect 150 may, e.g., be realized as a via connection extending through the MOL 162 layer and down to the buried interconnect 130 embedded in the FEOL 160. Hence, the gate electrode 101 that is connected to the buried interconnect 130 may be electrically contacted through the local interconnect 150 which can be accessed from above by the contact 170. This is a particular advantage for semiconductor circuits where the BEOL 164 comprises conductive lines that are not laterally aligned with the gate electrodes 101. By using the buried interconnect 130 and the local interconnect 150, the gate electrode 101 can be contacted from above at a position that may be aligned with the metal layer of the BEOL 164 so as to allow for a reduced footprint of the circuit 10. Further, multiple levels of staggered local interconnects may be avoided so as to reduce the risk for current leakage and shortcuts between the local interconnect 130 and neighboring gate electrodes 101.

Figure 3:
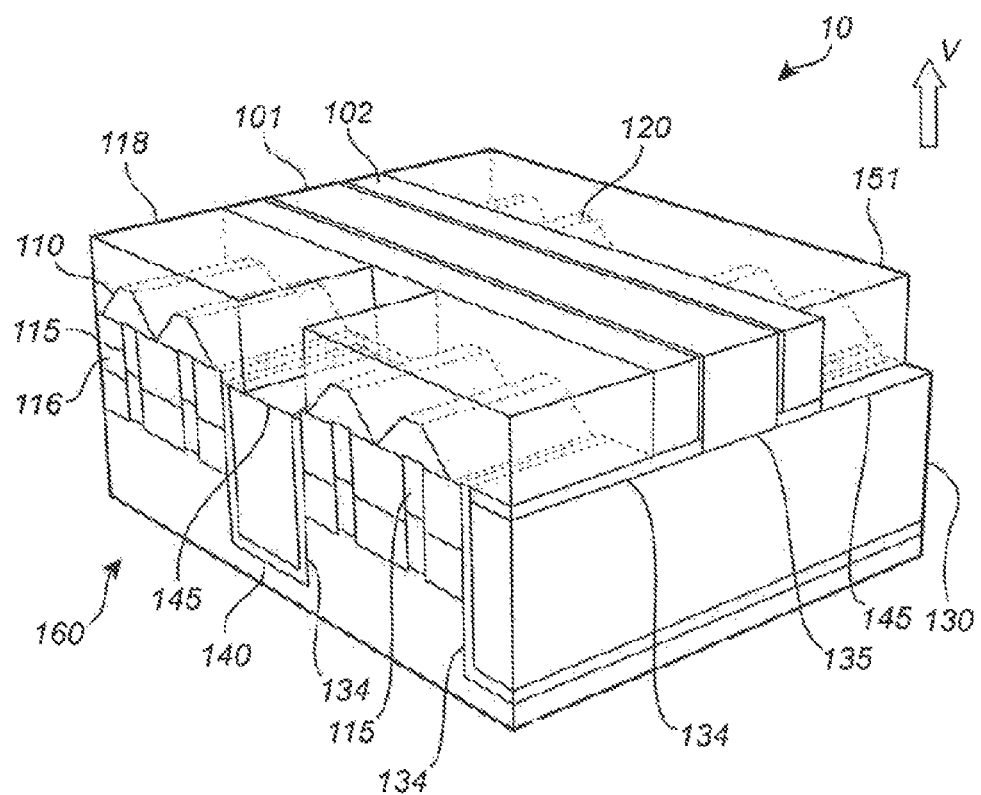

With reference to FIG. 3, there is shown a perspective view of a portion of a semiconductor device 10 that may be similarly configured as the semiconductor devices described with reference to FIG. 1 or 2.

According to this embodiment, the semiconductor device 10 may comprise a FEOL portion 160 in which a grid of parallel fins 115 may be arranged. The FEOL 160 may also comprise buried interconnects 130, 140, which may be arranged as conductive lines in isolated trenches extending along the fins 115. An isolating layer 134 may be formed around the buried interconnects 130, 140 so as to allow the buried interconnects 130, 140 to be electrically insulated from surrounding layers.

The source/drain regions 110, 120 may be formed by, e.g., epitaxial growth on the fins 115. Further, a gate electrode 101 may be formed on the fins 115, between the source regions 110 and drain regions 120. An isolating layer, or spacer 102, may be formed to isolate the gate electrode 101 from its surroundings. Also, a local interconnect 118 may be formed on the source/drain regions 110, 120. The transistors formed by the fins 115, the source/drain regions 110, 120, the gate oxide (not shown) and the gate electrode 101 may be referred to as a finFET.

As shown in FIG. 3, the isolating layer 134 formed on the buried interconnects 130, 140 may be provided with contact openings 135, 145 for electrically contacting the gate electrode 101 and the local interconnect 150, respectively. In this embodiment, the semiconductor circuit 10 may comprise a buried interconnect 130 that is electrically connected to the gate electrode 101 metal through contact opening 135. Further, a buried interconnect 140 may be electrically connected to a local interconnect 151, which may further be arranged to contact the source/drain regions 110, 120 spaced from the gate electrode 101, by means of an opening 145 in the isolating layer 134.

Figure 4A:
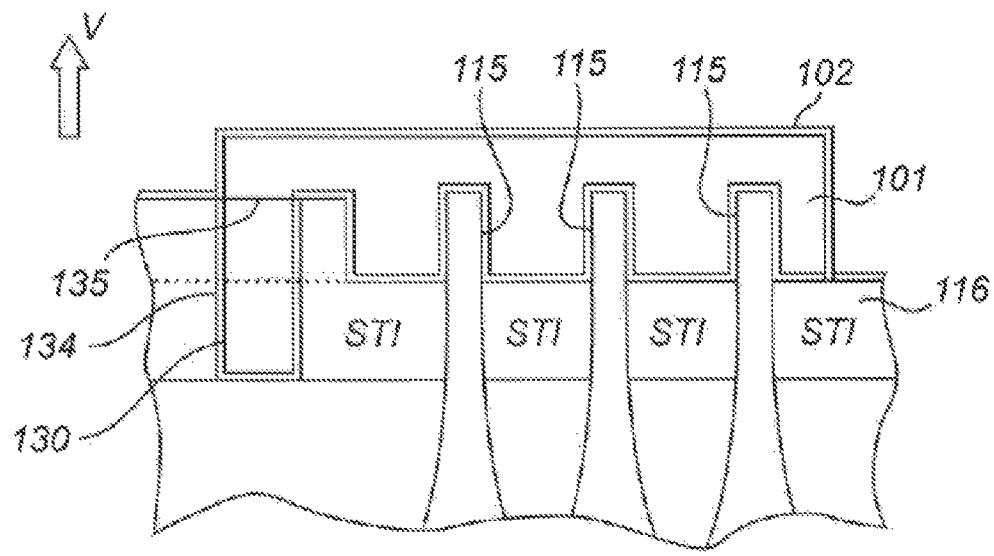

With reference to FIGS. 4a and b, there is shown a cross sectional view of a portion of a semiconductor circuit 10 that may be similarly configured as the semiconductor device described with reference to FIGS. 1-3. The cross section is taken along the direction of the gate region 101.

According to the embodiment depicted in FIG. 4a, the top of the fins 115 may form an essentially flat surface with the buried interconnect 130. The gate electrode 101 at the location of the bottom contact portions 135 may hence be provided on the essentially flat surface. As shown in FIG. 4a, a buried interconnect 130 may be arranged such that its top is positioned at essentially the same height, as seen in a vertical direction, V (indicated by an arrow), as the top of the fins 115.

Figure 4B:
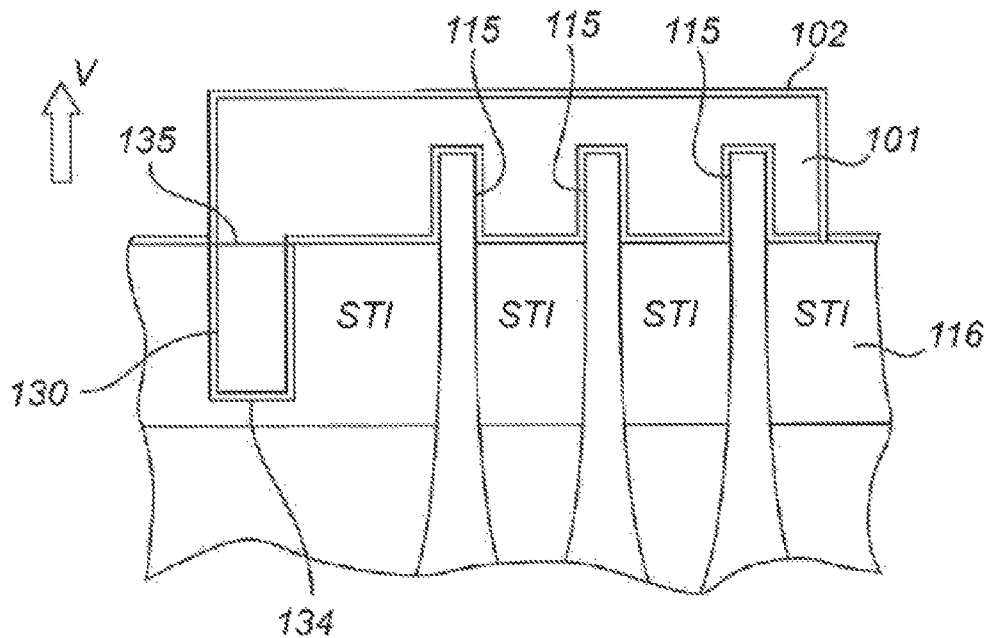

According to the embodiment shown in FIG. 4b, the fins 115 may protrude out from the surface onto which the gate electrode 101 is to be provided. The top of the fins 115 is hence arranged at a higher level, relative to the vertical direction, than the surrounding isolation 116. The surrounding isolation 116 may, e.g., be formed of a planarized shallow trench isolation (STI) 116, wherein the planarized surface is indicated in FIG. 4a by a dotted line. The gate electrode 101 may hence at least partially enclose or receive the protruding portions of the fins 115. As shown in FIG. 4b, the buried interconnect 130 may be arranged such that its top is positioned at a lower level than the top of the fins 115. The buried interconnect 130 may form an essentially flat surface with the surrounding isolation 116.

FIGS. 4a and 4b further show the gate dielectric in between the fins and the gate electrode.

Figure 5:
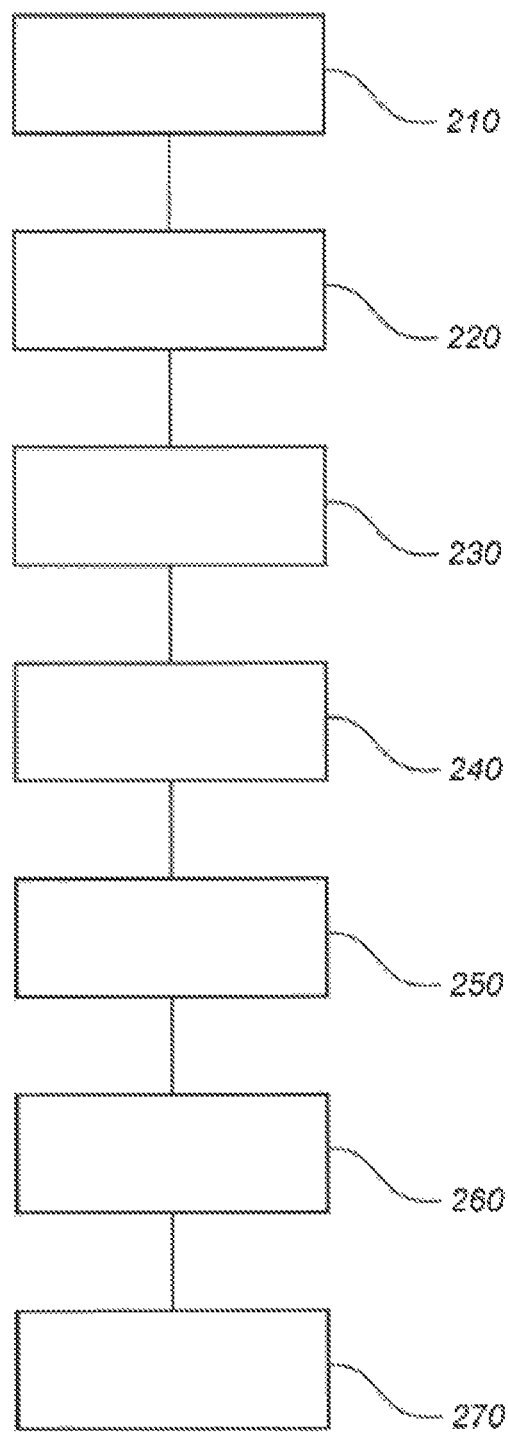
FIG. 5 is a flow chart illustrating a method of manufacturing a semiconductor circuit according to an embodiment.

FIG. 5 is a schematic illustration of a method of manufacturing a semiconductor circuit similar to the semiconductor circuits as described in connection with FIGS. 1-4.

The method may comprise forming 210 a first buried interconnect in a FEOL and forming 220 a plurality of transistors in the FEOL, wherein each transistor comprises a source region, a drain region and a gate region. The gate region is arranged at least between the source region and the drain region and comprises a gate electrode. Further, the first buried interconnect may be electrically connected 230 to the gate region from below through a bottom contact portion of the gate electrode.

The method may further comprise the steps of forming 240 a first local interconnect in a MOL, such that the first local interconnect is arranged distant from a gate electrode of a first one of the transistors and distant from a neighboring gate electrode of a second one of the transistors, and the first local interconnect is arranged to electrically connect the first buried interconnect to a metal layer of a BEOL.

In some embodiments, the method comprises forming 250 a second local interconnect in the MOL, such that the second local interconnect is arranged to electrically connect the source region or the drain region of at least one of the transistors to a second contact area of the metal layer. The second contact area may be located between the gate electrode of the first one of the transistors and the neighboring gate electrode of the second one of the transistors and be aligned with the first contact area electrically connected to the first local interconnect.

Finally, the method may comprise forming 260 a second buried interconnect in the FEOL, and forming 270 a third local interconnect in the MOL such that the third local interconnect is arranged to electrically connect the second buried interconnect to at least one source regions or drain region of at least one of the transistors so as to supply the source region or drain region with an electrical power.

A semiconductor circuit comprising a FEOL with a plurality of transistors formed by drain regions, gate regions and source regions is thus provided. Further, a first buried interconnect is arranged in the FEOL and electrically connected to the gate region(s) from below through a bottom contact portion of the gate region is also provided.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term Includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A semiconductor circuit, comprising:
   a front-end-of-line comprising a plurality of transistors, each transistor comprising a source region, a drain region, and a gate region, wherein the gate region is situated between the source region and the drain region and comprises a gate electrode, wherein the gate electrode is electrically isolated from its surroundings;
   a first buried interconnect situated in the front-end-of-line and electrically connected to the gate region from below through a bottom contact portion of the gate electrode, the first buried interconnect having a length extension in a direction orthogonal to a direction of a length extension of the gate electrode and being laterally arranged between the source/drain regions or the plurality of transistors;
   a back-end-of-line comprising a first contact area of a metal layer; and
   a middle-end-of-line comprising a first local interconnect configured to electrically connect the first buried interconnect to the first contact area of the metal layer of the back-end-of-line, wherein the first local interconnect is situated distant from a gate electrode of a first transistor of the plurality of transistors and distant from a neighboring gate electrode of a second transistor of the plurality of transistors, and in a region where there are no source or drain regions, and wherein the plurality of transistors is a plurality of fin-based transistors, each fin-based transistor comprising a fin extending between a source region and a drain region of the fin-based transistor.

2. The semiconductor circuit of claim 1, wherein the first contact area, electrically connected to the first local interconnect, is aligned with at least one second contact area of the metal layer, the second contact area being located between the gate electrode of the first transistor of the plurality of transistors and the neighboring gate electrode of the second transistor of the plurality of transistors, and wherein the middle-end-of-line further comprises a second local interconnect configured to electrically connect the second contact area to the source region or to the drain region of at least one transistor of the plurality of transistors.

3. The semiconductor circuit of claim 1, wherein the metal layer of the back-end-of-line comprises at least one metal strip aligned between the gate regions of neighboring transistors and electrically connected to at least some of the neighboring transistors through local interconnects in the middle-end-of-line.

4. The semiconductor circuit of claim 1, further comprising a second buried interconnect situated in the front-end-of-line and electrically connected to at least one source region or drain region through a third local interconnect situated in the middle-end-of-line, and configured to supply the source region or the drain region with an electrical power.

5. The semiconductor circuit of claim 4, wherein the second buried interconnect is configured to supply a plurality of source regions of the source regions or a plurality of drain regions of the drain regions with an electrical power.

6. The semiconductor circuit of claim 1, wherein a plurality of parallel fins are situated in the front-end-of-line and wherein the first buried interconnect is situated in a trench essentially in parallel with the parallel fins.

7. The semiconductor circuit of claim 1, wherein the bottom contact portion of the gate electrode is in between the top of the fins and the bottom of the gate electrode.

8. The semiconductor circuit of claim 1, wherein the fins protrude out from a surface of a surrounding isolation onto which the gate electrode is provided.

9. The semiconductor circuit of claim 8, wherein the gate electrode at least partially encloses or receives protruding portions of the fins, and wherein a top of the first buried interconnect is positioned at a lower level than the top of each of the fins, such that the first buried interconnect forms a flat surface with the surrounding isolation.

10. A semiconductor circuit, comprising:
a front-end-of-line comprising a plurality of transistors, each transistor comprising a source region, a drain region, and a gate region, wherein the gate region is situated between the source region and the drain region and comprises a gate electrode, wherein the gate electrode is electrically isolated from its surroundings;
a first buried interconnect situated in the front-end-of-line and electrically connected to the gate region from below through a bottom contact portion of the gate electrode, the first buried interconnect having a length extension in a direction orthogonal to a direction of a length extension of the gate electrode and being laterally arranged between the source/drain regions or the plurality of transistors, wherein the first buried interconnect is electrically connected to a plurality of gate electrodes of the gate electrodes, arranged in parallel strips;
a back-end-of-line comprising a first contact area of a metal layer; and
a middle-end-of-line comprising a first local interconnect configured to electrically connect the first buried interconnect to the first contact area of the metal layer of the back-end-of-line, wherein the first local interconnect is situated distant from a gate electrode of a first transistor of the plurality of transistors and distant from a neighboring gate electrode of a second transistor of the plurality of transistors, and in a region where there are no source or drain regions.

11. The semiconductor circuit of claim 10, comprising a plurality of buried interconnects arranged in a parallel grid orthogonal to the plurality of gate electrodes arranged in parallel strips.

12. The semiconductor circuit of claim 10, wherein the first local interconnect is arranged in between two adjacent parallel strips of gate electrodes such that the first local interconnect extends through a layer in which the two adjacent parallel strips of gate electrodes are arranged and down to the first buried interconnect.

13. A semiconductor circuit, comprising:
a front-end-of-line comprising a plurality of transistors, each transistor comprising a source region, a drain region, and a gate region, wherein the gate region is situated between the source region and the drain region and comprises a gate electrode, wherein the gate electrode is electrically isolated from its surroundings;
a first buried interconnect situated in the front-end-of-line and electrically connected to the gate region from below through a bottom contact portion of the gate electrode, the first buried interconnect having a length extension in a direction orthogonal to a direction of a length extension of the gate electrode and being laterally arranged between the source/drain regions or the plurality of transistors;
a back-end-of-line comprising a first contact area of a metal layer;
a middle-end-of-line comprising a first local interconnect configured to electrically connect the first buried interconnect to the first contact area of the metal layer of the back-end-of-line, wherein the first local interconnect is situated distant from a gate electrode of a first transistor of the plurality of transistors and distant from a neighboring gate electrode of a second transistor of the plurality of transistors, and in a region where there are no source or drain regions; and
a buried power interconnect adapted to connect a source/drain region of the source/drain regions with an electric power supply and extending into regions of the front-end-of-line in a region where there are no source or drain regions.

* * * * *